United States Patent [19]

Sugiyama et al.

[11] 4,034,367

[45] July 5, 1977

[54] ANALOG-TO-DIGITAL CONVERTER UTILIZING A RANDOM NOISE SOURCE

[75] Inventors: Takashi Sugiyama; Takashi Tsuda, both of Musashino, Japan

[73] Assignee: Yokogawa Electric Works, Ltd., Tokyo, Japan

[22] Filed: Feb. 20, 1975

[21] Appl. No.: 551,283

[30] Foreign Application Priority Data

Feb. 28, 1974 Japan .............................. 49-23900
Feb. 28, 1974 Japan .............................. 49-23903

[52] U.S. Cl. ...................... 340/347 AD; 340/347 M
[51] Int. Cl.² ........................................ H03K 13/02
[58] Field of Search ............. 340/347 AD, 347 NT, 340/347 CC; 178/DIG. 3

[56] References Cited

UNITED STATES PATENTS

| | | | |
|---|---|---|---|
| 2,941,196 | 6/1960 | Raynsford et al. | 340/347 AD |
| 3,244,808 | 4/1966 | Roberts | 178/DIG. 3 |
| 3,525,093 | 8/1970 | Marshall | 340/347 AD |
| 3,560,957 | 2/1971 | Miura et al. | 340/347 DA |
| 3,562,420 | 2/1971 | Thompson | 178/DIG. 3 |
| 3,656,152 | 4/1972 | Gundersen | 340/347 DA |
| 3,662,376 | 5/1972 | Furukawa et al. | 340/347 AD |
| 3,824,584 | 7/1974 | Coia | 340/347 AD |
| 3,838,413 | 9/1974 | Wehrmann | 340/347 AD |
| 3,877,022 | 4/1975 | Lehman et al. | 340/347 AD |
| 3,879,724 | 4/1975 | McDonald | 340/347 AD |
| 3,949,170 | 4/1976 | Shionoya | 340/347 AD X |

OTHER PUBLICATIONS

Federal Scientific Corp., "Dithering Increases Dynamic Range . . . ," Aug. 1973, pp. 1–8.

Primary Examiner—Thomas J. Sloyan
Attorney, Agent, or Firm—Parmelee, Johnson & Bollinger

[57] ABSTRACT

An analog-to-digital converter arranged to accept an analog input signal and to convert it into an output having digital form. The converter is characterized by a reference random noise source which generates random noise signals with uniform amplitude occurrence probability density in a given range, and by an amplitude comparator arranged to repeatedly compare the amplitude of the random noise signal with the amplitude of a signal varying with the analog signal to be converted. The amplitude comparator supplies output pulses in accordance with the comparisons, e.g., whenever the analog signal amplitude is greater than the random noise amplitude, and the number of pulses from the amplitude comparator in a measurement interval then digitally corresponds to the value of the analog signal and may be utilized, as in a display. Resolution of the converter is increased beyond the minimum amplitude increment of the random noise source signal in one embodiment by superposition on either the analog signal or the random noise signal of a triangular wave with an amplitude greater than the minimum amplitude increment of the random noise signal, and in another embodiment by superposition of a second random noise signal.

9 Claims, 24 Drawing Figures

ANALOG-TO-DIGITAL CONVERTER UTILIZING A RANDOM NOISE SOURCE

BACKGROUND OF THE INVENTION

1. Field of the Invention

The present invention relates to analog-to-digital converters of the type capable of converting analog input signals into digital output signals. Such converters are useful, e.g., in measurement apparatuses with digital display, and in the field of process control with digital computers.

2. Description of the Prior Art

Prior art analog-to-digital converters typically operate on certainty phenomena and are subject in varying degrees to errors due to noise, such as noise from power supply lines, common mode noise, and the like. Techniques for eliminating the influences of such noise often are complex and detract from the serviceability of prior art converters.

SUMMARY OF THE INVENTION

A principal object of the present invention is to provide an improved analog-to-digital converter which is simple in construction and at the same time capable of operation with high resolution and conversion accuracy. Another object of the invention is to provide an analog-to-digital converter capable of operation free from influences due to noises such as common mode noise and noise from power supply lines. Still another object of the invention is to provide an analog-to-digital converter more suitable for commercial use.

In a preferred embodiment of the invention to be described hereinbelow in detail, the analog-to-digital converter comprises reference random noise source means capable of generating random noise signals at a rate of uniform amplitude occurrence probability density in a given range (e.g., a given voltage range), and amplitude comparator means capable of repeatedly comparing the amplitude of the random noise signal with that of a signal varying with the analog signal to be converted, and of supplying output pulses in accordance with the comparisons. The converter is responsive to the number of pulses from the amplitude comparator means, and thus provides an output in digital form corresponding to the value of the analog signal.

In accordance with other aspects of the invention, the analog-to-digital converter comprises means for increasing the resolution of the converter beyond the minimum amplitude increment of the random noise signal. In one embodiment, resolution is increased by means for generating a triangular wave with an amplitude greater than the minimum amplitude increment of the random noise signal, and for combining the triangular wave with the analog signal and random noise signal prior to amplitude comparison. In another embodiment, resolution is increased by means for generating a second random noise signal and for combining it with the other signals prior to amplitude comparison.

Other objects, aspects and advantages of the invention will be pointed out in, or apparent from, the detailed description hereinbelow, considered together with the following drawings.

DESCRIPTION OF THE PREFERRED EMBODIMENTS

Figure 1:
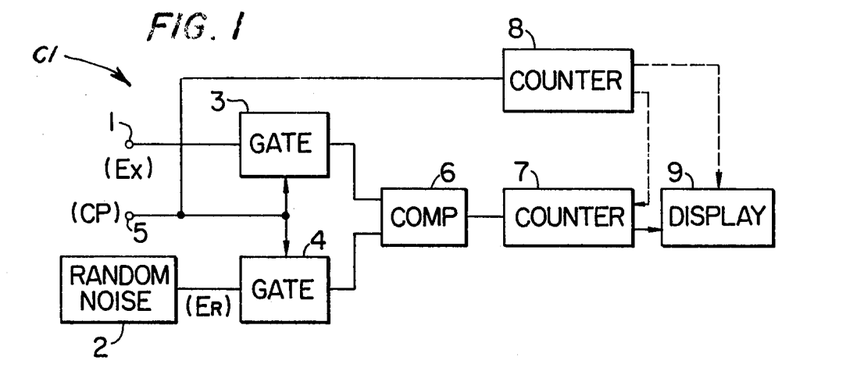
FIGS. 1 through 4 are block diagrams illustrating particular embodiments of the invention.

FIG. 1 illustrates an analog-to-digital converter C1 arranged in accordance with the present invention to converted to digital form. The converter C1 has a reference random noise source 2 capable of generating a random noise signal $E_R$ at a rate of uniform occurrence probability density in a given amplitude range such as, for example, a voltage range of OV to $+E_{RM}V$ or a voltage range of $-E_{RM}V$ to $+E_{RM}V$. the noise source 2 may be formed, for example, by a digital-to-analog converter driven by an M-sequence noise generator, an L-sequence noise generator, or an I-sequence noise generator, or by a noise diode or a thyratron circuit driven to generate a noise by discharge. Gate circuits 3 and 4 accept the analog signal $Ex$ and noise signal $E_R$, as well as a clock pulse CP which is applied to terminal 5 and which acts to open the gates. An amplitude comparator circuit 6 has one input terminal connected through gate circuit 3 to the analog signal $Ex$ which is to be converted, and the other input terminal connected through gate circuit 4 to the reference random noise signal $E_R$. The comparator circuit 6 compares the amplitudes of the two gated signals $Ex$ and $E_R$ and generates an output pulse train signal reflecting the results of the comparisons. A counter 7 counts pulses from the amplitude comparator circuit 6, and another counter 8 counts clock pulses CP and is arranged at the end of a counted interval to transfer the accumulated count value $n$ of the counter 7 to a display 9, and at the same time to clear the data in the counter 7.

Converter C1 operates in the following manner. First, the data in the counters 7 and 8 are cleared. When a clock pulse CP is applied to the terminal 5, the gates 3 and 4 are opened, and the signal $Ex$ to be converted and the reference random noise signal $E_R$ are applied to the input terminal of the amplitude comparator 6. The counter 8 counts the clock pulse. The comparator 6 compares the two signals $Ex$ and $E_R$ and is conditioned to generate an output pulse when and only when $Ex > E_R$. (When $Ex \leq E_R$, the comparator does not generate an output pulse.) Thus, as the gates 3 and 4 are repeatedly opened in response to the clock pulse CP, a pulse train signal appears at the output terminal of the comparator 6 according to the result of comparison of the two signals $Ex$ and $E_R$. The output pulses in the train are counted by the counter 7, and at the same time the counter 8 receives the clock pulse CP and increases its count one by one. This operation continues until the count of the counter 8 reaches a predetermined value N. When the counter 8 counts the value N, the accumulated value $n$ which has been counted by the counter 7 is transferred to the display 9. Concurrently, the data in the counters 7 and 8 are cleared. A series of these operations is thereafter repeated.

Equation (1) below indicates the relationship between the analog signal E$x$ and the value shown on the display 9, i.e., the value $n$ registered by the counter 7 when the counter 8 counted the value N.

$$Ex = E_M \times \frac{n}{N} \qquad (1)$$

In Eq. (1), $E_M$ is the maximum constant value assumed by the random noise signal $E_R$. The value $n$ counted by the counter 7 thus is proportional to the value of analog signal E$x$, and the converter obtains a digital output signal having a constant relationship with the analog signal E$x$.

Figure 2:
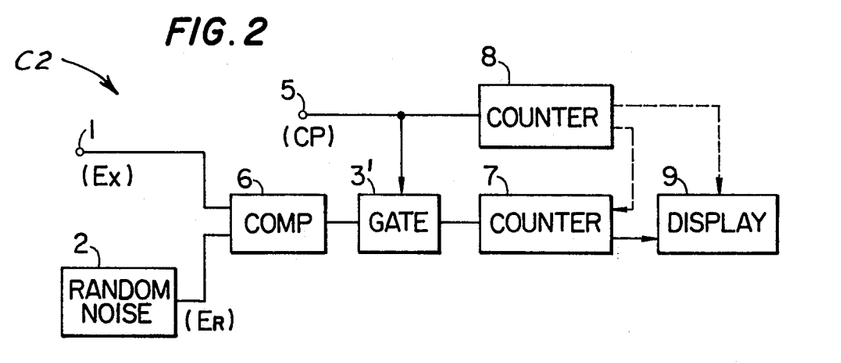

FIG. 2 shows a modified converter circuit C2, in which a single gate circuit 3' is able to replace the gate circuits 3 and 4 of FIG. 1 by being located between the amplitude comparator circuit 6 and the counter 7.

Figure 3:
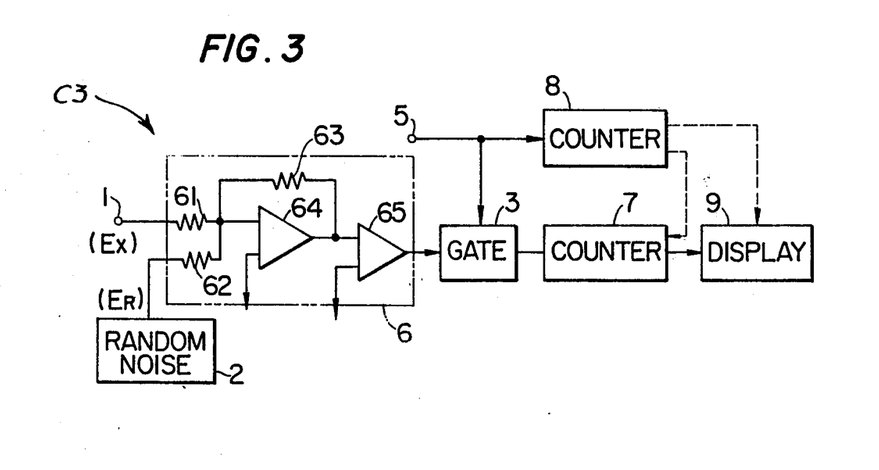

FIG. 3 illustrates a converter C3 employing a preferred construction of the amplitude comparator circuit 6, comprising an adder with input resistors 61 and 62, a feedback resistor 63, and an operational amplifier 64; and a comparator 65 for comparing the output of the adder with a fixed or zero potential. In this circuit, the analog signal E$x$ to be converted and the reference random noise signal $E_R$ are added together and then compared with zero potential. An output will be present or absent at the output terminal of the comparator 65 according to the relative values of E$x$ and $E_R$.

Figure 4:
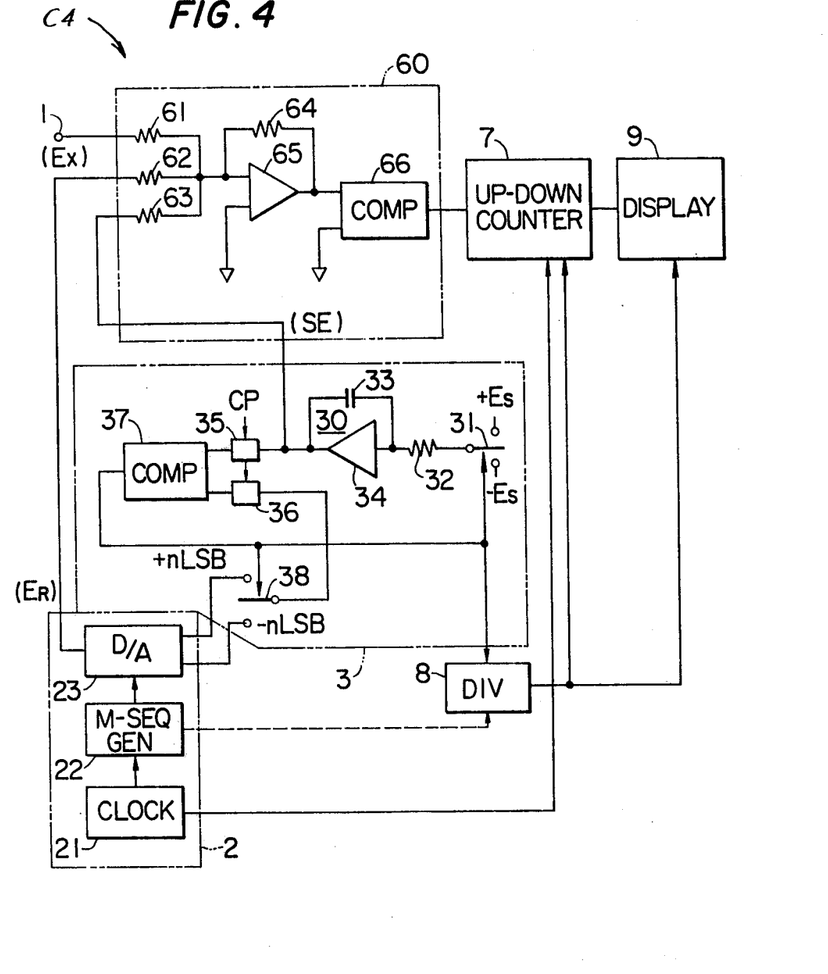
Figure 5:
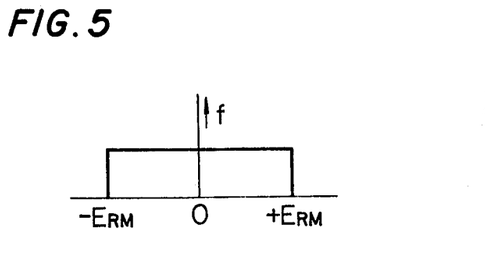
FIG. 5 is a diagram showing the probability characteristics of random noise signal used by the invention.

FIG. 4 illustrates another embodiment C4 of the invention with an input terminal 1 to which an analog signal E$x$ to be converted is applied, and a reference random noise source 2 capable of generating random noise signals at a rate of uniform occurrence probability density $f$ in a range, for example, of $-E_{RM}$V to $+E_{RM}$V as shown graphically in FIG. 5. In this embodiment, the reference random noise source 2 is formed with a clock pulse generator 21, an M-sequence signal generator 22 controlled by the clock pulses from the clock pulse generator 21, and a digital-to-analog converter 23 driven by the M-sequence signal generator 22. Converter C4 also includes a triangular wave signal generator 3 which comprises a selector switch 31 for selecting either reference voltage $+E_S$ or reference voltage $-E_S$, an input resistor 32, a capacitor 33, an amplifier 34, gate circuits 35 and 36, a comparator 37, and a selector switch 38 for selecting either voltage $+n$LSB or voltage $-n$LSB supplied from the reference random noise source 2. The resistor 32, capacitor 33 and amplifier 34 form an integrator 30 which integrates the reference voltage supplied through the switch 31. In the comparator 37, the output of the integrator supplied through the gate circuit 35 is compared with the voltage $+n$LSB or $-n$LSB supplied from the reference random noise source 2 through the gate circuit 36 and selector switch 38. The comparator 37 drives the selector switches 31 and 38 according to the compared result. Converter C4 further includes an amplitude comparator 60 which comprises input resistors 61, 62 and 63, a feedback resistor 64, and an operational amplifier 65. These resistors and amplifier form an adder which adds up the input signals supplied through the input resistors 61, 62 and 63 respectively. A comparator 66 compares the output from the adder with zero potential. An up-down counter 7 counts up or down the output pulses from the amplitude comparator 60, and a display 9 displays a digital signal taken from the up-down counter 7. A frequency divider (or a counter) 8 divides the period of the triangular wave signal in a ratio of $1/m$ (where $m$ is an arbitrary integer) and generates a signal for clearing data in the up-down counter 7 and in the display part 9.

Analog-to-digital converter C4 operates in the following manner. First, for explanatory simplicity, it will be assumed that the converter has no triangular wave signal generator 3. Then, the amplitude comparator 60 receives a random noise signal $E_R$ from the digital-to-analog converter 23 of the reference random noise source 2 through the input resistor 62, and a signal E$x$ through the input resistor 61. These signals are added together by the adder comprising the feedback resistor 64 and operational amplifier 65. The added result is compared with zero potential by the comparator 66. The amplitude comparator 60 generates a bipolar pulse or no pulse according to the relative values of the two signals $E_R$ and E$x$ as follows:

an up pulse output when $E_R +$ E$x > 0$
no pulse output when $E_R +$ E$x = 0$
a down pulse output when $E_R +$ E$x < 0$ The output pulses are applied to the up-down counter 7, which is arranged to count the pulses for a given period of time measured by $m$ times the period of the M-sequence signal from the M-sequence signal generator 22. This period of time is determined by the M-sequence signal supplied to the frequency divider 8 from the M-sequence signal generator 22 as indicated by the dotted line. The frequency divider 8 divides the period of the M-sequence signal in a ratio of $1/m$ and generates a signal for clearing data in the up-down counter 7 and in the display 9.

Figures 6A, 6B:
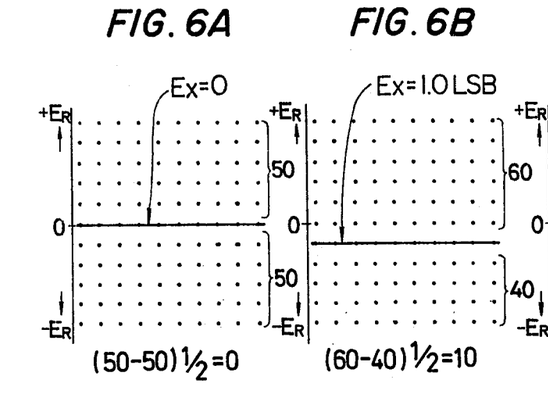
FIGS. 6A to 6C, 7, and 8A to 8C are diagrams illustrating the operation of the particular embodiment of the invention shown in FIG. 4.
Figure 6C:
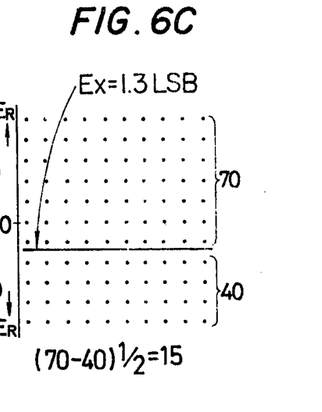

The value counted by the counter 7 for a given period corresponds to the value of the analog signal E$x$ which is to be converted. The reason for this correspondence can be understood by referring to FIGS. 6A to 6C, in which each dot (.) indicates an amplitude value which the random noise signal $E_R$ can assume. The minimum amplitude value for noise signal $E_R$ is represented by LSB. FIG. 6A shows the instance where E$x = 0$; FIG. 6B, the instance where E$x = LSB$; and FIG. 6C, the instance where E$x = 1.3 LSB$. In FIGS. 6A to 6C, the number of dots above E$x$ corresponds to the number of up pulses and the number of dots below E$x$ corresponds to the number of down pulses. Hence the difference between the numbers of dots above and below E$x$ corresponds to the counted value of E$x$. (The difference is 0 in FIG. 6A, 10 in FIG. 6B, and 15 in FIG. 6C.) The up-down counter 7 counts this difference to make it possible to obtain a digital signal having a constant relationship with the signal E$x$.

When E$x = 1.3 LSB$ (FIG. 6C), the count value is as large as 15 and hence it is impossible to obtain a digital signal correctly from the analog signal E$x$ to an accuracy better than the minimum resolution (i.e., LSB) of the random noise signal $E_R$.

Figure 7:
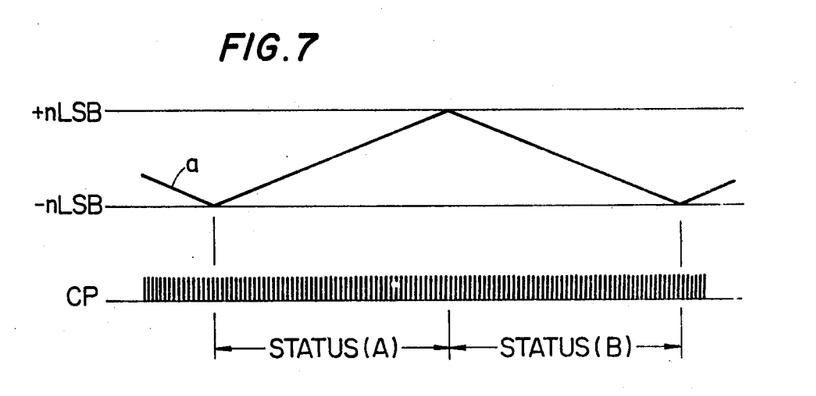

In the embodiment C4 of the invention illustrated in FIG. 4, the use of triangular wave signal generator 3 improves apparent resolution (LSB) and conversion accuracy as well. The operation of converter C4 as affected by a triangular wave signal SE applied from the triangular wave signal generator 3 will now be described. The signal SE, as shown in FIG. 7, is formed so that its amplitude range is an integer multiple of the incremental value LSB of the random noise signal $E_R$, that is, ±nLSB, and is further formed so that its period T is an integer multiple of the cycle period of the commercial power source used. The amplitude and period of the signal SE can be adjusted by changing the integrating time-constant of integrator 30 which depends on the value of power source voltage ±Es, the value of power source voltage ±nLSB, and the values of resistor 32 and capacitor 33. In the triangular wave signal generator circuit 3, two different statuses A and B can be assumed; under the status A, switch 31 connects to voltage +ES and switch 38 connects to voltage +nLSB; and under the status B, switch 31 connects to voltage −Es and switch 38 connects to voltage −nLSB. The period of the clock pulse CP which controls opening and closing of the gate circuits 35 and 36 is assumed to be much smaller than that of the triangular wave signal SE.

Assuming status B exists in the triangular wave signal generator 3, then the triangular wave signal from the integrator 30 continues falling from its initial value as shown by (a) of FIG. 7. The comparator 37 compares this signal with the reference voltage −nLSB which is constantly supplied from the digital-analog converter 23. At the occurrence of the first clock pulse CP immediately after the value of signal SE has become equal to the value of −nLSB, the comparator 37 causes the switch 31 to connect to voltage +Es, and the switch 38 to connect to +nLSB, thus causing status B to be transferred to the status A. At the same time, the comparator 37 resets the up-down counter 7 and the display 9 through the frequency divider 8. This makes measurement ready to start. In status A, the triangular wave signal SE continues rising. The comparator 37 compares the value of this signal with the value of the reference voltage +nLSB which is constantly supplied from the digital-analog converter 23. At the instant the triangular wave signal output SE reaches +nLSB, status A is transferred to the status B by the output of the comparator 37. As a result, the triangular wave signal begins falling. In this manner, statuses A and B alternate and a triangular wave signal output with the amplitude range ±nLSB is obtained at the output terminal of the integrator 30.

This triangular wave signal is then applied to the amplitude comparator 60 through the resistor 63. The adder comprising the feedback resistor 64 and the operational amplifier 65 adds up the random noise signal $E_R$, the signal Ex to be converted, and the triangular wave signal SE. The comparator 66 compares the sum of these signals with zero potential. Then the amplitude comparator 60 generates a bipolar pulse or no pulse according to the relative values of signals $E_R$, Ex and SE, as follows:

an up pulse output when $E_R + Ex + SE > 0$
no pulse output when $E_R + Ex + SE = 0$
a down pulse output when $E_R + Ex + SE < 0$ These pulses are counted by the up-down counter 7 for a given period which is m times the period the triangular wave signal. The value so counted is displayed on the display 9.

Figures 8A, 8B:
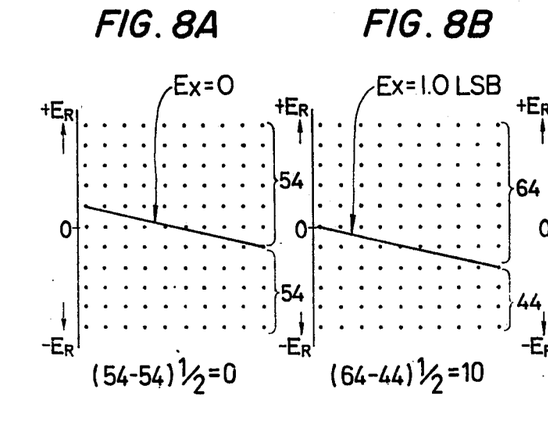
Figure 8C:
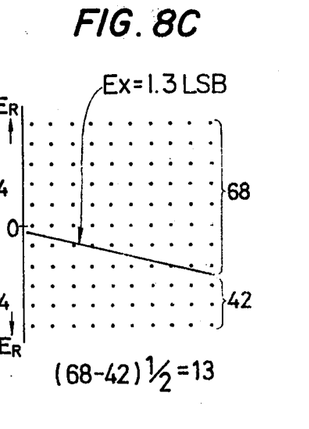

The amplitude comparison operation with the use of signal SE will be described by referring to FIGS. 8A to 8C; 8A is the instance where Ex = 0; 8B, the instance where Ex = +LSB; and 8C, the instance where Ex = +1.3LSB.

When Ex = +1.3LSB, the count value is 1.3, which agrees with the value of the signal to be converted. Thus, by use of triangular signal SE as described, the apparent resolution can be increased without changing the minimum amplitude LSB of the random noise signal $E_R$.

In this embodiment, the triangular wave signal generator is constituted of a circuit comprising the integrator 30 and the comparator 37. Instead, the triangular wave signal generator may be constituted of a circuit capable of generating a triangular wave signal whose amplitude is larger than the minimum amplitude of the random noise signal $E_R$.

Figure 9:
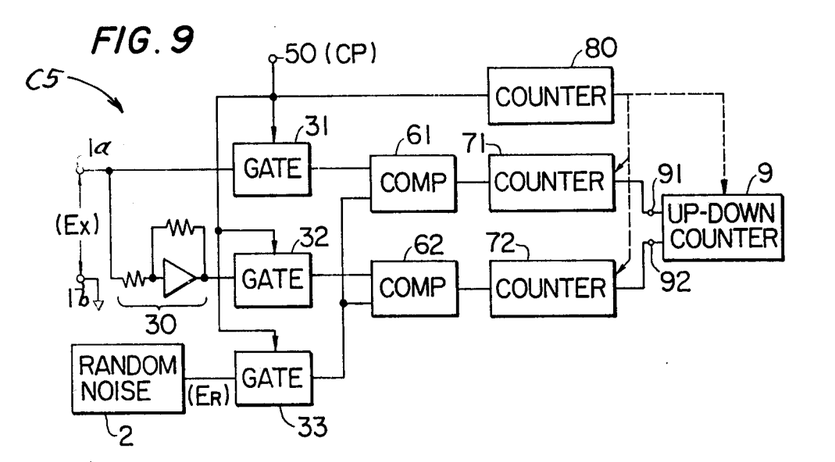
FIGS. 9 to 12 are block diagrams showing other embodiments of the invention.
Figure 10:
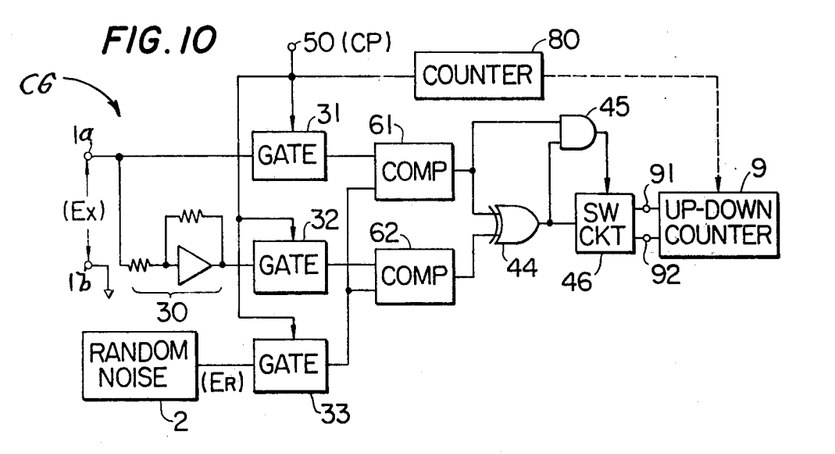

FIGS. 9 and 10 show in block form other embodiments of the invention modified from the converter C1 shown in FIG. 1. In converter C5 shown in FIG. 9, an analog signal Ex to be converted is applied between input terminals 1a and 1b. A first amplitude comparator 61 has one input terminal connected to receive the signal Ex through a gate circuit 31, and the other input terminal connected to receive a random noise signal $E_R$ from a reference random noise source 2 through a gate circuit 33. The first comparator 61 compares the amplitude of the signal Ex with that of the signal $E_R$ and generates a pulse train signal according to the compared result. A second amplitude comparator 62 has one input terminal connected to receive the inverse −Ex of signal Ex through a polarity inverter 30 and a gate circuit 32, and the other input terminal connected to receive the random noise signal $E_R$ through the gate circuit 33. The second comparator 62 compares the amplitudes of the two signals −Ex and $E_R$ with each other and generates a pulse train signal according to the compared result. When a clock pulse CP is applied to a terminal 50, the gates 31, 32 and 33 open in response thereto to cause the amplitude comparators 61 and 62 to generate or not to generate a pulse signal according to the respective values of signal Ex relative to $E_R$, and signal −Ex relative to $E_R$. The output pulses from the amplitude comparator 61 and the output pulses from the amplitude comparator 62 are counted by counters 71 and 72 respectively. The values $n_1$ and $n_2$ counted by the counters 71 and 72 respectively during a measurement interval when a counter 80 counts to a predetermined value N are supplied to the up and down terminals 91 and 92 of an up-down counter 9, which in turn counts the value $(n_1 - n_2)$ and displays the result.

The relationships between the signal Ex to be converted and the count values $n_1$ and $n_2$ reached by the counters 71 and 72 when the counter 80 counts to a given value N may be expressed by Eqs. (2) and (3) below.

$$Ex + V = \frac{n_1}{N} \qquad (2)$$

$$-Ex + V = \frac{n_2}{N} \qquad (3)$$

where V represents the reference value of the random noise signal $E_R$ including common mode noise. From Eqs. (2) and (3), the following is derived.

$$Ex = \frac{n_1 - n_2}{2N} \qquad (4)$$

As apparent from Eq. (4), the difference between the values $n_1$ and $n_2$ counted by the counters 71 and 72, i.e., the value counted (or the value displayed) by the counter 7 is proportional to the value of the signal Ex to be converted. Thus, a digital signal having a constant relationship with the analog signal Ex can be obtained.

FIG. 10 is a block diagram showing another embodiment C6 of the invention. In this embodiment, the output terminals of amplitude comparators 61 and 62 are connected respectively to the input terminals of an exclusive OR circuit 44. The output terminal of OR circuit 44 is connected through a switch circuit 46 to the input terminals 91 and 92 of an up-down counter 9. An AND circuit 45 receives outputs from the amplitude comparator 61 and OR circuit 44, and has its output connected to control switch circuit 46. The switch circuit 46 is operated so that an output pulse, when supplied from only the amplitude comparator 61, is applied to the up terminal 91 (i.e., the adding terminal) of the up-down counter 9, and so that an output pulse, when supplied from only the amplitude comparator 62, is applied to the down terminal 92 (i.e., the subtracting terminal) of the up-down counter 9. Thus, according to this embodiment, the counter 9 directly indicates the value $(n_1 - n_2)$ appearing in Eq. (4).

In converter C6 shown in FIG. 10, a triangular wave signal SE may be added to the signals Ex and $-$Ex as in the converter C4 shown in FIG. 4 to obtain the same enhanced resolution effects available with the converter shown in FIG. 4.

Figure 11:
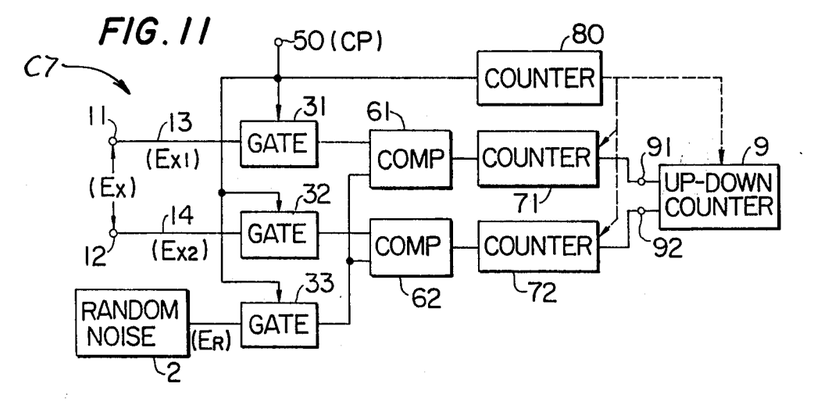

FIG. 11 shows in block form another embodiment C7 of the invention wherein an analog signal Ex to be converted is applied between a feed wire 13 and a return wire 14. An amplitude comparator 61 compares the amplitude of a signal $Ex_1$ on the feed wire 13 with that of a random noise signal $E_R$. Similarly, an amplitude comparator 62 compares the amplitude of a signal $Ex_2$ on the return wire 14 with that of random noise signal $E_R$. Thus, at the output terminals of the comparators 61 and 62, a pulse signal is generated or not generated according to the compared values of $Ex_1+V$ relative to $E_R$, and $O + V$ relative to $E_R$ (where V denotes a signal such as common mode noise).

In converter C7, the relationships between the signal Ex to be converted and the values $n_1$ and $n_2$ accumulated by the counters 71 and 72 at the instant the count by the counter 80 has reached the predetermined value N can be expressed by the following equations.

$$Ex + V = \frac{n_1}{N} \quad (5)$$

$$O + V = \frac{n_2}{N} \quad (6)$$

The following equation is derived from Eqs. (5) and (6).

$$Ex = \frac{n_1 - n_2}{N} \quad (7)$$

As apparent from Eq. (7), the difference between the values $n_1$ and $n_2$ counted by the counters 71 and 72, that is, the value counted by the up-down counter 9, corresponds to the signal Ex which is to be converted.

Figure 12:
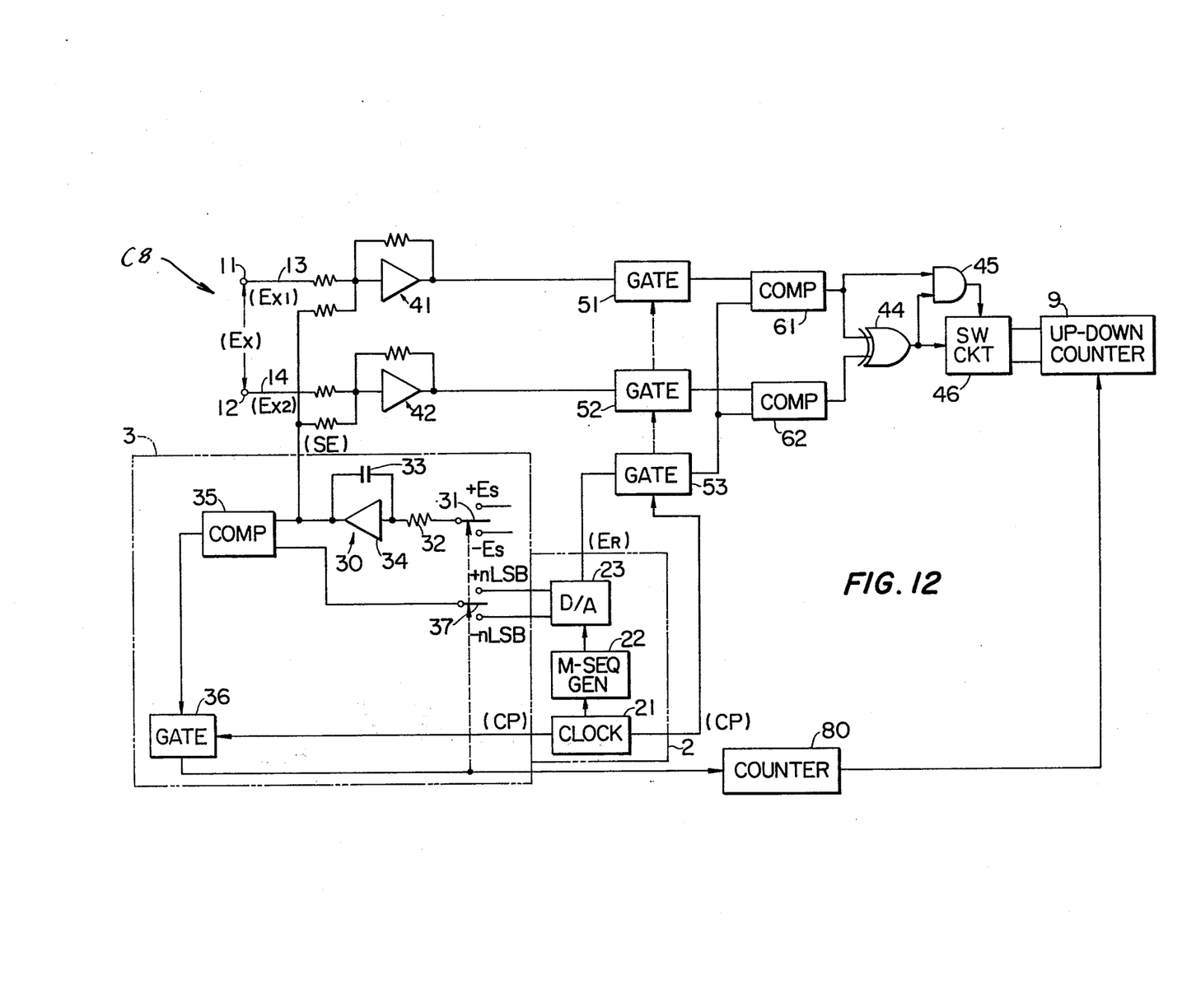

FIG. 12 shows in block form another embodiment C8 of the invention developed from the converter C7 shown in FIG. 11. In FIG. 12, adders 41 and 42 are connected into a feed wire 13 and a return wire 14 respectively, and a triangular wave signal SE from a triangular wave signal generator 3 is superposed on a signal $Ex_1$ on the feed wire 13 and on a signal $Ex_2$ on the return wire 14. In converter C8, the construction of the triangular wave signal generator 3 and reference random noise source 2 is similar to that employed for the converter C4 shown in FIG. 4. The output pulses from amplitude comparators 61 and 62 are treated by a switch circuit similar to the one shown in converter C6 shown in FIG. 10. Accordingly, the analog signal is digitally counted and displayed by up-down counter 9.

Figure 13A:
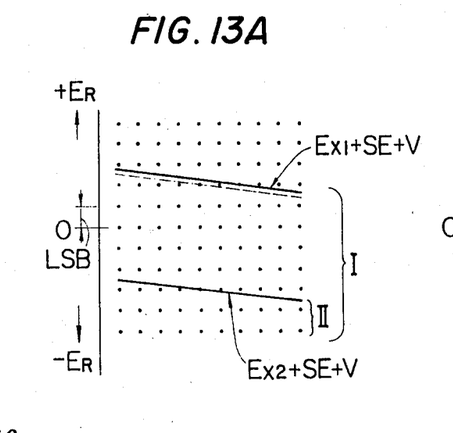
FIGS. 13A and 13B are diagrams illustrating the operation of the converter shown in FIG. 12.

FIG. 13A is a diagram useful for illustrating the operations of amplitude comparators 61 and 62 in converter C8. In FIG. 13A, each dot (.) represents an amplitude value which the random noise signal $E_R$ can assume (where LSB is the minimum amplitude value). The number of dots included in the area I below the line $Ex_1 + Se + V$ corresponds to the number $n_1$ of pulses generated from the amplitude comparator 61. Similarly, the number of dots included in the area II below the line $Ex_2 + SE + V$ corresponds to the number $n_2$ of pulses generated from the amplitude comparator 62. These relationships can be given as $$Ex_1 + SE + V = n_1 \quad (8)$$
$$Ex_2 + SE + V = n_2 \quad (9)$$

Then the following equation is derived from Eqs. (8) and (9).

$$Ex_1 - EX_2 = n_1 - n_2 \quad (10)$$

In FIG. 12, when the signal Ex is applied between the terminals 11 and 12, the relationship $Ex_1 - EX_2 = Ex$ exists. Hence the signal Ex is proportional to the value $n_1 - n_2$. Thus a digital signal having a constant relationship with the signal Ex can be obtained from the up-down counter 9.

Figure 13B:
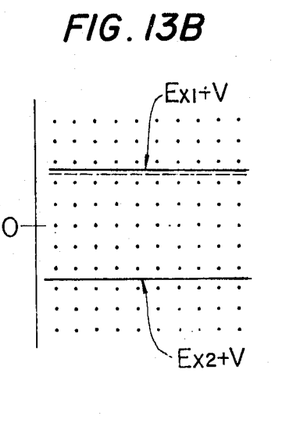

FIG. 13B is a diagram useful for illustrating the operations of amplitude comparators 61 and 62 of converter C8 without the triangular wave signal SE superposed on the signal $Ex_1$ on the feeding wire and the signal $Ex_2$ on the return wire. In this case, when the signal $Ex_1$ changes as indicated by the dotted line, this change is not reflected as a change in the number of the output pulses if the change in the signal $Ex_1$ is below the amplitude value LSB of the random noise signal $E_R$. In other words, without the triangular wave signal SE applied, the conversion accuracy depends on the minimum amplitude value LSB of the random noise signal $E_R$. However, with the triangular wave signal SE superposed both on the signal $Ex_1$ on the feed wire and on the signal $Ex_2$ on the return wire (FIG. 13A), a slight change (as indicated by the dotted line) in the signal $Ex_1$ is reflected by a change in the number of dots, which in turn represents a change in the number of output pulses.

Therefore, in converter C8, an analog-to-digital conversion with high resolution and conversion accuracy can be realized. In this converter, the analog signal Ex can be expressed in terms of the difference between the number of output pulses from the amplitude comparator 61 and the number of output pulses from the amplitude comparator 62. This makes it possible to realize an analog-to-digital converter which operates free from time and temperature drift in the reference value of random noise signal $E_R$ and in other constants or circuit elements, as well as from noises such as common mode noise.

Figure 14:
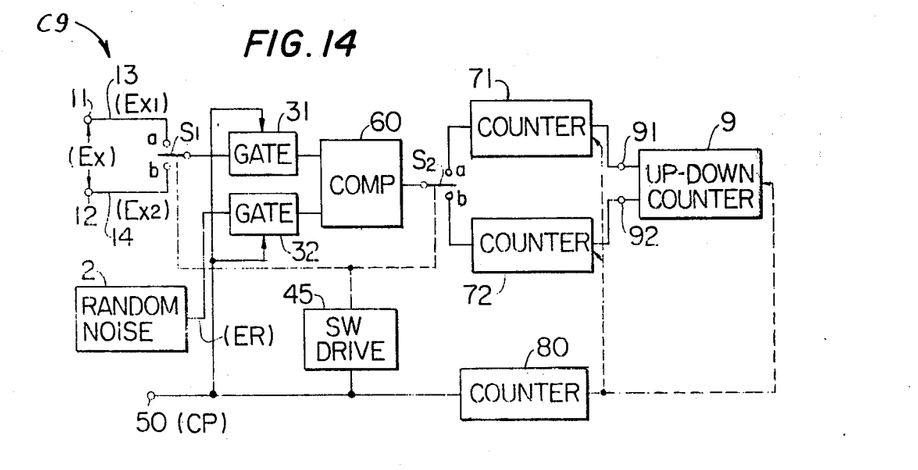
FIGS. 14 and 15 are block diagrams showing other embodiments of the invention.

FIG. 14 shows another converter C9 developed from the converter C7 shown in FIG. 11. In converter C9, a single amplitude comparator 60 is used in place of two amplitude comparators 61 and 62. The comparator 60 has one input terminal receiving either the signal $Ex_1$ on the feed wire 13 or the signal $Ex_2$ on the return wire 14 through a selector switch $S_1$ and a gate circuit 31, and the other input terminal receiving the random noise signal $E_R$ from the reference random noise source 2 through a gate circuit 32. The comparator 60 compares the signal $Ex_1$ or $Ex_2$ with the signal $E_R$ and generates a pulse train signal according to the compared result. The selector switch $S_2$ operates synchronously with the switch $S_1$ to switch the output pulse of the comparator 60 into the counters 71 and 72.

Converter C9 is functionally similar to converter C7 shown in FIG. 11, except that the comparator 60 alternately compares the signals $Ex_1$ and $Ex_2$ with the signal $E_R$ on a time sharing basis.

Figure 15:
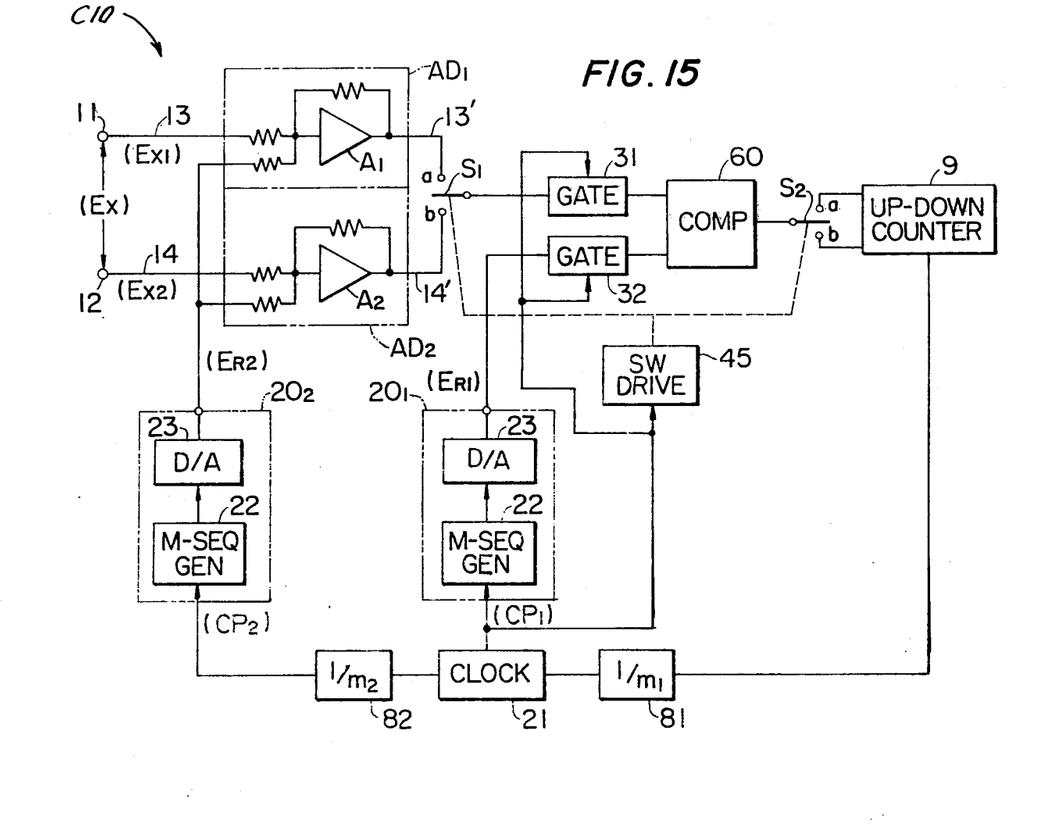

FIG. 15 shows in block form still another embodiment C10 of the invention developed from the converter C9 shown in FIG. 14. In this example, first adder $AD_1$ is connected into the feed wire 13, and second adder $AD_2$ is connected into the return wire 14. There are provided first and second reference random noise sources $20_1$ and $20_2$ capable of generating random noise signals $ER_1$ and $ER_2$ respectively. Converter C10 operates in the following manner. The first adder $AD_1$ adds up the signal $Ex_1$ applied to the terminal 11, the common mode noise V, and the random noise signal $ER_2$ from the second reference random noise source $20_2$, and generates the output $Ex_1 + V + E_{R2}$ over the feeding wire 13'. Similarly, the second adder $AD_2$ adds up the signal $Ex_2$ applied to the terminal 12, the common mode noise V, and the random noise signal $E_{R2}$ from the second random noise source $20_2$, and generates the output $Ex_2 + V + E_{R2}$ over the return wire 14'. When in the switching state where switches $S_1$ and $S_2$ are positioned at contact $a$ (this state will hereinafter be referred to as "first phase"), the amplitude comparator 60 compares the signal on the feeding wire 13' with the random noise signal $E_{R1}$ from the first reference random noise source $20_1$. As a result of comparison, the comparator 60 generates an output pulse when $Ex_1 + V + E_{R2} > E_{R1}$, or does not generate an output pulse when $Ex_1 + V + E_{R2} \leq E_{R1}$. The up-down counter 9 counts, in an additive fashion, the output pulses from the comparator 60. These operations continue until $n$ numbers of clock pulses CPI are applied to a circuit 45 which drives the switches $S_1$ and $S_2$. The drive circuit 45, when given $n$ numbers of clock pulses, drives the switches $S_1$ and $S_2$ to be positioned at contact $b$. (This state is referred to as the "second phase".) In the second phase, the amplitude comparator 60 compares the signal on the feeding wire 14' with the random noise signal $E_{R1}$. Then, as in the first phase, the comparator 60 generates an output pulse when $Ex_2 + V + E_{R2} > E_{R1}$, or does not generate an output pulse when $Ex_2 + V + E_{R2} \leq E_{R1}$. The up-down counter 9 counts, in a subtractive fashion, these output pulses. A series of these operations continue until $n$ numbers of clock pulses have been applied to the drive circuit 45 after the end of the first phase (i.e., after the start of the second phase). In this manner, the first and second phases are repeated alternately. The repetition of the first and second phases continues until $m_1$ numbers of clock pulses have been applied to a frequency divider 81, to cause the frequency divider to send a reset pulse to the up-down counter 9 where the difference $n_1 - n_2$ between the two kinds of pulses generated in the first and second phases is displayed.

Equations (11) and (12) below indicate the relationships between the signal $Ex$ to be converted and the total numbers $n_1$ and $n_2$ of output pulses from the comparator 60 in the first and second phases respectively.

$$Ex_1 + V + E_{R2} = n_1/m_1 \quad (11)$$
$$Ex_2 + V + E_{R2} = n_2/m_1 \quad (12)$$

(Where V represents a common mode noise)

Because the signal $Ex$ is applied between the feed wire 13 and the return wire 14, the following equation is obtained by subtracting Eq. (12) from Eq. (11).

$$Ex = Ex_1 - Ex_2 = \frac{n_1 - n_2}{m_1} \quad (13)$$

As is apparent from Eq. (13), the difference $n_1 - n_2$ between the numbers of output pulses generated in the first and second phases, and counted by the up-down counter 9 in a unit time length, has a constant relationship with the signal $Ex$. Thus a digital signal with a constant relationship to the signal $Ex$ can be obtained without being affected by external causes such as common mode noise.

From the viewpoint of practical operation, the period of the clock pulse $CP_2$ which drives the M-sequence signal generator 22 of the second reference random noise source $20_2$ is made longer than that of the clock pulse $CP_1$ which drives the M-sequence signal generator 22 of the first reference random noise source $20_1$. The frequency divider 82 divides the clock pulse from the clock pulse generator 21 in a ratio of $1/m_2$. By this arrangement, the frequency of the random noise signal $E_{R2}$ from the second reference random noise source $20_2$ is held low and the bandwidths of the adders $AD_1$ and $AD_2$ are limited.

One noteworthy feature of converter C10 is that the random noise signal $E_{R2}$ from the second reference random noise source $20_2$ is superposed on both the signal $Ex_1$ on the feed wire 13 and on the signal $Ex_2$ on the return wire 14. The consequences of this feature will be described below in more detail.

Figure 16:
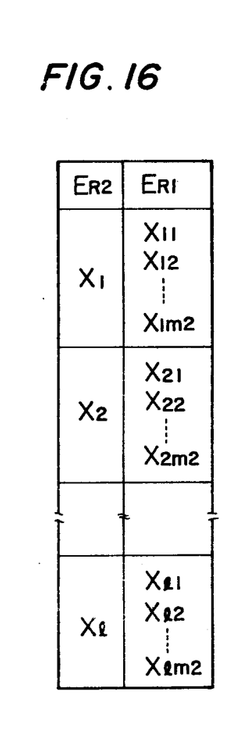
FIG. 16 is a diagram showing an illustrative example of the relationship between two random noise signals used in the converter shown in FIG. 15.

FIG. 16 is a diagram useful for illustrating the relationship between the random noise signal $E_{R1}$ of the first reference random noise source $20_1$ and the random noise signal $E_{R2}$ of the second reference random noise source $20_2$. As FIG. 16 represents, the value of $E_{R1}$ varies irregularly as often as m2 times from $X_{11}$ to $X_{1m2}$ during the period where the signal $E_{R2}$ has the value $X_1$. When the M-sequence signal generator is used for the generation of signals $E_{R1}$ and $E_{R2}$, it is desirable, from a practical point of view, that the M-sequence periods $T_1$ and $T_2$ be prime relative to each other. To achieve this, the dividing ratio $m_1$ of the frequency divider 81 is determined as follows with respect to the periods $T_1$ and $T_2$.

$$m_1 = n \cdot T_1 \cdot T_2 / \tau^2$$

$(n = 1, 2, 3 \ldots)$ where $\tau$ denotes the period of clock pulse CP.

Figure 17:
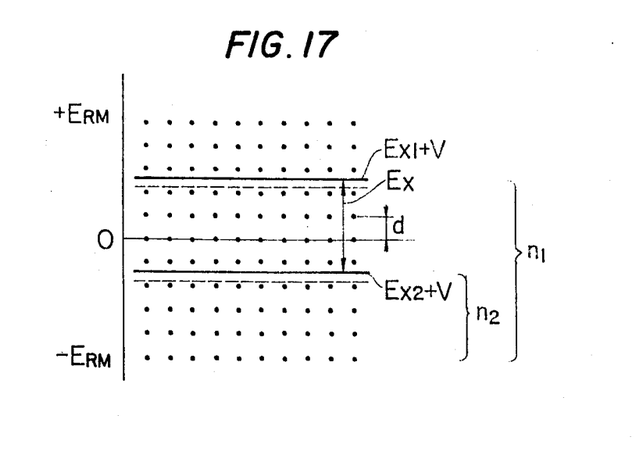
FIGS. 17 and 18 are diagrams illustrating the operation of the converter shown in FIG. 15.

The operation of converter C10 without the random noise signal $E_{R2}$ applied will be described by referring to FIG. 17. Each dot (·) indicates an amplitude value which the random noise signal $E_{R1}$ can assume. The number of dots below $Ex_1 + V$ corresponds to the number $n_1$ of the output pulses generated from the amplitude comparator 60 in the first phase, and the number of dots below $Ex_2 + V$ corresponds to the number $n_2$ of the output pulses generated from the comparator 60 in the second phase. In other words, the difference $n_1 - n_2$ between the numbers of output pulses from the comparator 60 in the first and second phases corresponds to the value of the signal Ex to be converted.

If the value of the signal Ex changes as indicated by the dotted line in FIG. 17 in the range below the resolution (minimum amplitude value) of the random noise signal $E_{R1}$, such change does not emerge as a change in the number of output pulses. In this event, it is impossible to convert the signal Ex into a digital signal with an accuracy higher than the resolution of the random noise signal.

Figure 18:
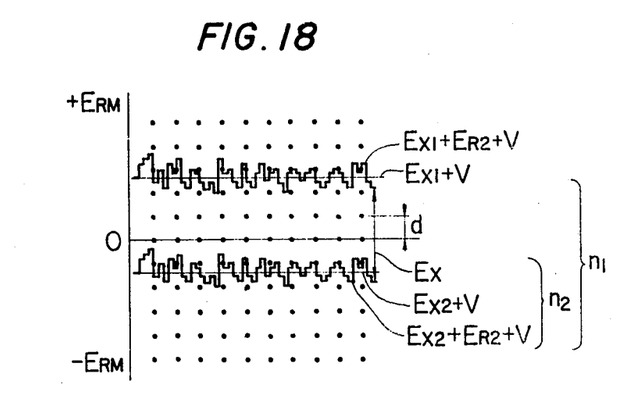

In converter C10, the second reference random noise source $20_2$ is employed to improve apparent resolution and conversion accuracy. More specifically, FIG. 18 illustrates operation of the converter where the random noise signal $ER_2$ is applied from the second reference random noise source $20_2$. As shown, $Ex_1 + E_{R2} + V$ and $Ex_2 + E_{R2} + V$ are the signals centering $Ex_1 + V$ and $Ex_2 + V$ respectively. Thus, if small changes in the values $Ex_1 + V$ and $Ex_2 + V$ occur, such changes are picked up in terms of the change in the number of output pulses, to enable greater apparent resolution to be realized.

Eq. (14) below mathematically expresses the value of analog signal Ex.

$$Ex = (Ex_1 + V) - (Ex_2 + V)$$
$$= n*d + r > 0 \qquad (14)$$

where:
$n = 1, 2, 3 \ldots$
$d$ is the minimum amplitude value of $E_{R1}$.
$r$ is a fraction of $d$, $0 \leq r < d$ When the circuit is operated without the random noise signal $E_{R2}$ applied from the second reference random noise source $20_2$, as exemplified by FIG. 17, the fraction $r$ is ignored.

With the random noise signal $E_{R2}$ applied from the second reference random noise source $20_2$, the converted value (or measured value) when $E_{R2} = X$ is expressed as $$\text{Measured Value} = Md \qquad (15)$$

where $$M = \left[ \frac{x + r + n*d}{d} \right]$$

and the brackets [ ] represent Gauss's notation.

The value $E_{R2} = X$ varies uniformly in amplitude in the range $-d \leq X \leq d$. The measured value reached after a given length of time or after a given number of comparisons is given by the mean value of X, as expressed by the following equation.

$$\text{Measured Value} = \int_{-d}^{d} M*d \cdot \frac{1}{2d} dx$$

-continued $$= \frac{1}{2} \left( \int_{0}^{d-r} n\,dx + \int_{d-r}^{d} (n+1)dx + \int_{-r}^{0} (n+1)dx \right.$$

$$\left. + \int_{-d}^{-r} n\,dx \right)$$

$$= n*d + r \qquad (16)$$

As is apparent from Eq. (16), the measured value includes the fraction $r$. In other words, with the signal $E_{R2}$ applied, it becomes possible to obtain the reading of a fraction $r$.

In Eq. (16), when it is assumed that the value X which the signal $E_{R2}$ can assume varies uniformly in amplitude in the range $-\beta d - 2d \leq X \leq 2d + \alpha d$, then the measured value may be given in four ways for different values of $\alpha$ and $\beta$.

$$\text{Measured Value} = n*d + r + \frac{1}{4 + \alpha + \beta} \{(\alpha + \beta)(d - r) - \alpha d\}$$
$$\text{when } 0 \leq \alpha \leq 1 - \frac{r}{d}, 0 \leq \beta \leq \frac{r}{d} \qquad (17)$$

$$\text{Measured Value} = n*d + r + \frac{1}{4 + \alpha + \beta} \{(\alpha + \beta - 1)(d - r)\}$$
$$\text{when } 1 - \frac{r}{d} \leq \alpha \leq 1, 0 \leq \beta \leq \frac{r}{d} \qquad (18)$$

$$\text{Measured Value} =$$
$$n*d + r + \frac{1}{4 + \alpha + \beta} \{(\alpha + \beta)(d - r) - (\alpha + \beta)d + r\}$$
$$\text{when } 0 \leq \alpha \leq 1 - \frac{r}{d}, \frac{r}{d} \leq \beta \leq 1 \qquad (19)$$

$$\text{Measured Value} =$$
$$n*d + r + \frac{1}{4 + \alpha + \beta} \{(\alpha + \beta - 1)(d - r) - \beta d + r\}$$
$$\text{when } 1 - \frac{r}{d} \leq \alpha \leq 1, \frac{r}{d} \leq \beta \leq 1 \qquad (20)$$

In Eqs. (17) to (20), the third term is the error term. Hence, to avoid allowing the error term to be dependent on the value to be measured (i.e., on the value $r$), the factor of $r$ in the third term should be zero.

The following table below shows the conditions required in order for the factor of $r$ to be zero.

| Eqs. | conditions factor of $r = 0$ | error term | remarks |
|---|---|---|---|
| (17) | $\alpha + \beta = 0$ | $-1/4 \, \alpha d$ | error term = 0 if $\alpha = \beta = 0$ |
| (18) | $\alpha + \beta = 1$ | 0 | |
| (19) | $\alpha + \beta = 1$ | 0 | |
| (20) | $\alpha + \beta = 2$ | $1/6 (1 - \beta)d$ | error term = 0 if $\alpha = \beta = 0$ |

By determining the range of $E_{R2}$ to meet the above conditions, the error can be minimized or eliminated.

In converter C10, the induction noise from commercial power sources can readily be removed by making the period of one measurement, i.e., the period for resetting the up-down counter 9, to be an integer multiple of the period of the commercial power source frequency.

Figure 19:
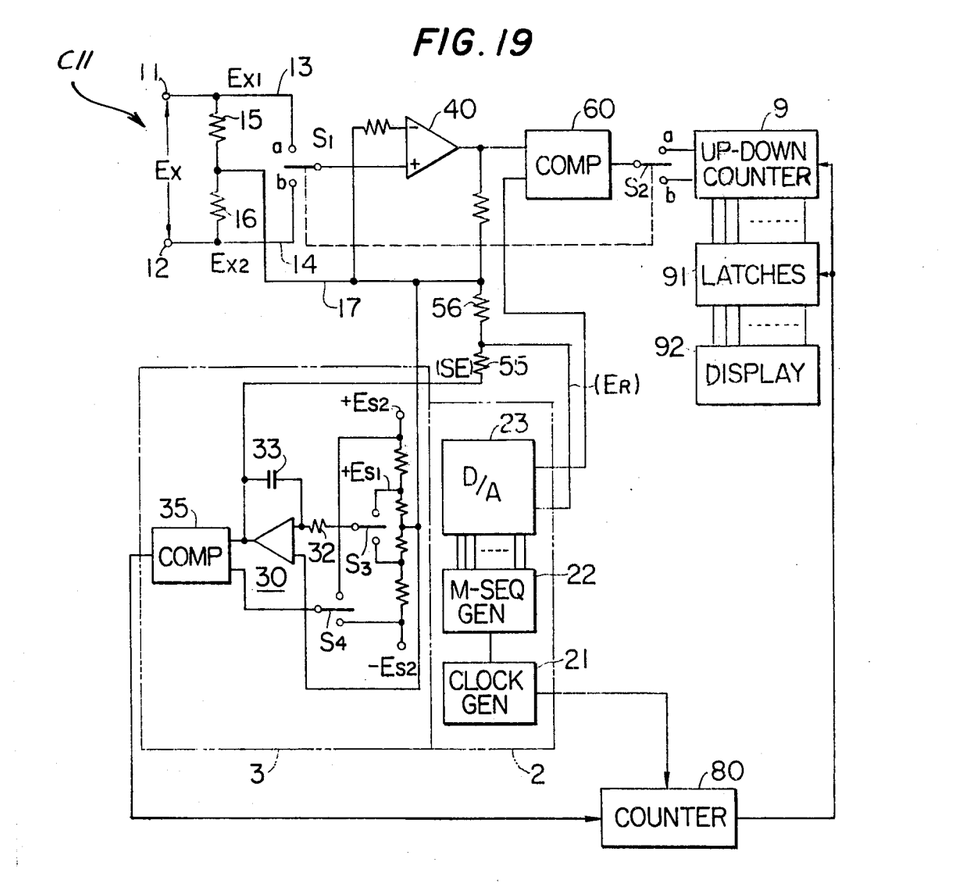
FIG. 19 is a block diagram showing still another embodiment of the invention.

FIG. 19 shows in block form another embodiment C11 of the invention wherein resistor 15 and 16 are connected between terminals 11 and 12, and the junction between these resistors is connected to a common line 17. The signal $Ex_1$ on the feeding wire 13, and the signal $Ex_2$ on the return wire 14 are alternately connected through a selector switch $S_1$ to an amplifier 40, and then applied to one input terminal of amplitude comparator 60. A triangular wave signal SE from a triangular wave signal generator 3 is added in series to a random noise signal $E_R$ from a reference random noise source 2. The resultant signal is applied to the other input terminal of the amplitude comparator 60. The output of the comparator 60 is supplied to either the up terminal $a$ or the down terminal $b$ of the up-down counter 9 through a selector switch $S_2$, and passed through latches 91 to a display 92. The amplitude comparator 60 is operated in the same manner as the one shown in FIG. 15. The generation of the triangular wave signal SE applied in series to the random noise signal $E_R$, and the effects of such operation are similar to those available with the converters shown in FIGS. 4 and 12.

Although specific embodiments of the invention have been disclosed herein in detail, it is to be understood that this is for the purpose of illustrating the invention, and should not be construed as necessarily limiting the scope of the invention, since it is apparent that many changes can be made to the disclosed structures by those skilled in the art to meet particular applications.

We claim:

1. An analog-to-digital converter for converting an input analog signal into an output digital signal, comprising:
   reference random noise source means for generating random noise signals at a rate of uniform occurrence probability density in a given range;
   means for generating a triangular wave signal having an amplitude greater than the minimum amplitude increment of said random noise signal;
   a feed wire and return wire across which the analog signal to be converted is applied;
   amplitude comparator means for repeatedly comparing the amplitude of said random noise signal with that of the signal appearing on said feed wire and for supplying first output pulses in accordance with the comparisons, and for repeatedly comparing the amplitude of said random noise signal with that of the signal appearing on said return wire and for supplying second output pulses in accordance with the comparisons, the triangular wave signal being effectively superposed on one of the signals to be compared prior to the comparisons, and
   means responsive to the difference between the numbers of the first and second output pulses obtained from said amplitude comparator means to provide a digital output corresponding to the value of said analog signal to be converted.

2. An analog-to-digital converter as claimed in claim 1 wherein said amplitude comparator means comprises a first amplitude comparator for comparing the amplitude of said random noise signal with that of the triangular wave signal superposed on the signal appearing on said feed wire, and a second amplitude comparator for comparing the amplitude of said random noise signal with that of the triangular wave signal superposed on the signal appearing on said return wire.

3. An analog-to-digital converter as claimed in claim 1 wherein said amplitude comparator means is arranged on a time sharing basis for alternately effecting (a) a comparison among the amplitude of said random noise signal, the superposed triangular wave signal, and the signal appearing on said feed wire, and (b) a comparison among the amplitude of said random noise signal, the superposed triangular wave signal, and the signal appearing on said return wire.

4. An analog-to-digital converter for converting an input analog signal into an output digital signal, comprising;
   reference random noise source means for generating random noise signals at a rate of uniform occurrence probability density in a given range;
   second signal generator means for generating a second signal varying uniformly in a range greater than the minimum amplitude increment of said random noise signal;
   amplitude comparator means for repeatedly comparing the amplitude of the random noise signal from said reference random noise source means with the amplitude of a signal varying with the analog signal to be converted, the second signal being effectively superposed upon one of the signals to be compared prior to comparison, said amplitude comparison means supplying output pulses in accordance with the comparison; and
   means responsive to the number of output pulses obtained from said amplitude comparator means for providing a digital output corresponding to the amplitude value of said analog signal to be converted.

5. An analog-to-digital converter as claimed in claim 4 wherein said second signal generator means generates a triangular wave signal with an amplitude greater than the minimum amplitude increment of said random noise signal.

6. An analog-to-digital converter as claimed in claim 4 wherein said second signal generator means generates a second reference random noise signal at a rate of uniform occurrence probability density in a range greater than the minimum amplitude increment of the first random noise signal.

7. An analog-to-digital converter for converting an input analog signal into an output digital signal, comprising:
   first reference random noise source means for generating a first random noise signal at a rate of uniform occurrence probability density in a given range;
   second random noise source means for generating a second random noise signal at a rate of uniform occurrence probability density in a range greater than the minimum amplitude increment of said first random noise signal;
   a feed wire and a return wire across which the analog signal to be converted is applied;
   first adder means for adding up the signal appearing on said feed wire and the random noise signal from said second reference random noise source;
   second adder means for adding up the signal appearing on said return wire and the signal from second random noise source;
   amplitude comparator means for repeatedly comparing the amplitude of the output from said first adder means with that of the random noise signal from said first reference random noise source, and for repeatedly comparing the amplitude of the output from said second adder means with that of the random noise signal from said first reference random noise source, and for supplying first and second trains of output pulses in accordance with the respective comparisons; and
   means responsive to the difference between the numbers of pulses in the first and second trains of output pulses for providing a digital output corresponding to the value of the analog signal to be converted.

8. An analog-to-digital converter as claimed in claim 7 wherein the range of the random noise signal of said second reference random noise source means satisfies one of the conditions $$\alpha + \beta = 0$$
$$\alpha + \beta = 1$$
$$\alpha + \beta = 2$$

when the value X which the random noise signal of said second reference random noise source can assume varies in the range $-\beta d - id \leq X \leq id + \alpha d$, where $d$ is the minimum amplitude value of the random noise signal of said first reference random noise source, and $i$ is an arbitrary integer.

9. An analog-to-digital converter for converting an input analog signal into an output digital signal, comprising:

reference random noise source means for generating random noise signals at a rate of uniform occurrence probability density in a given range;

a feeding wire and a return wire across which the analog signal to be converted is applied;

first switch means for deriving signals alternately from said feed wire and said return wire on a time-sharing basis;

triangular wave signal generator means for generating a triangular wave signal with an amplitude greater than the minimum amplitude value of said random noise signal;

amplitude comparator means for repeatedly comparing the signal derived through said first switch with the sum of said triangular wave signal and said random noise signal and for supplying output pulses in accordance with the comparisons;

an up-down counter having an up input terminal and a down input terminal;

second switch means operated synchronously with said first switch means for switching the output pulses from said amplitude comparator into said up input terminal or said down input terminal; and display means for displaying an output signal corresponding to the value counted by said up-down counter.

* * * * *